(12) United States Patent
Bourgeault

(10) Patent No.: US 10,037,048 B1
(45) Date of Patent: Jul. 31, 2018

(54) METHODS FOR OPTIMIZING CIRCUIT PERFORMANCE VIA CONFIGURABLE CLOCK SKEWS

(71) Applicant: ALTERA CORPORATION, San Jose, CA (US)

(72) Inventor: Mark Bourgeault, Mississauga (CA)

(73) Assignee: ALTERA CORPORATION, San Jose, CA (US)

( * ) Notice: Subject to any disclaimer, the term of this patent is extended or adjusted under 35 U.S.C. 154(b) by 0 days.

(21) Appl. No.: 15/464,067

(22) Filed: Mar. 20, 2017

Related U.S. Application Data

(63) Continuation of application No. 14/639,735, filed on Mar. 5, 2015, now Pat. No. 9,602,106.

(51) Int. Cl.
| | |
|---|---|
| *H03K 19/00* | (2006.01) |
| *G06F 1/10* | (2006.01) |
| *G06F 1/06* | (2006.01) |
| *H03L 7/07* | (2006.01) |
| *G06F 17/50* | (2006.01) |

(52) U.S. Cl.
CPC .................. *G06F 1/10* (2013.01); *G06F 1/06* (2013.01); *G06F 17/5031* (2013.01); *G06F 17/5072* (2013.01); *G06F 17/5077* (2013.01); *H03L 7/07* (2013.01)

(58) Field of Classification Search
CPC .......... G06F 1/10; G06F 1/06; G06F 17/5031; G06F 17/5072; G06F 17/5077; H03L 7/07

USPC ........................................................ 326/93
See application file for complete search history.

(56) References Cited

U.S. PATENT DOCUMENTS

| | | | |
|---|---|---|---|
| 3,532,544 A | 10/1970 | Nozaki et al. | |
| 5,656,963 A | 8/1997 | Masleid et al. | |
| 6,233,707 B1 | 5/2001 | Potter et al. | |
| 7,107,477 B1 | 9/2006 | Singh et al. | |
| 7,346,861 B1* | 3/2008 | Lee ..................... | G06F 17/5054 |
| | | | 326/95 |
| 7,868,655 B2 | 1/2011 | Lewis et al. | |
| 7,872,512 B2 | 1/2011 | Lewis et al. | |
| 7,971,088 B2 | 6/2011 | Jung et al. | |
| 8,115,530 B2 | 2/2012 | Lewis et al. | |
| 8,427,213 B2 | 4/2013 | Lewis et al. | |
| 2003/0122577 A1* | 7/2003 | Veenstra ............. | G06F 17/5054 |
| | | | 326/38 |
| 2003/0163750 A1 | 8/2003 | Trivedi et al. | |

\* cited by examiner

*Primary Examiner* — Daniel D Chang
(74) *Attorney, Agent, or Firm* — Fletcher Yoder P.C.

(57) ABSTRACT

An integrated circuits with sequential logic circuitry is provided. The sequential logic circuitry may including latching circuits that receive clock signals from on-chip or off-chip clock sources. The clock signals may exhibit clock skew that is native to the integrated circuit. The natively existing clock skew can be leverage to perform time borrowing to help optimize circuit performance. The desired clock skew can be achieved by intelligent placement of the clock sources and deliberate routing of the clock signals from the clock sources to respective types of clock distribution networks on the integrated circuit.

20 Claims, 11 Drawing Sheets

METHODS FOR OPTIMIZING CIRCUIT PERFORMANCE VIA CONFIGURABLE CLOCK SKEWS

This is a continuation of U.S. patent application Ser. No. 14/639,735, entitled "Methods for Optimizing Circuit Performance via Configurable Clock Skews", filed Mar. 5, 2015, which is herein incorporated by reference in its entirety for all purposes.

BACKGROUND

This invention relates to latching circuits in integrated circuits, and more particularly, to ways of providing clock signals to the latching circuits to help logic designers improve circuit performance.

Integrated circuits typically contain combinational logic and sequential logic. Since combinational logic does not include storage elements, the output of a given combinational logic circuit is therefore determined solely by its present inputs. In contrast, sequential logic circuits contain storage elements with outputs that reflect the past sequence of their input values. As a result, the output of a sequential circuit is determined by both its present inputs and by the data stored in its storage elements.

In conventional flip-flop-based sequential logic circuits, the clock frequency must generally be slowed down sufficiently to accommodate the delay associated with the circuits' slowest combinational logic paths. Even if circuitry in a fast logic path produces a valid signal in less time than a slow logic path, that signal is not used until the edge of the next clock pulse. While the regularity imposed by conventional flip-flop circuits is beneficial for ease of circuit design, it tends to limit performance in certain situations.

Time borrowing schemes have been developed to try to address this problem. For example, time borrowing schemes have been developed in which various delays are provided in the clocks feeding the edge triggered flip-flops on a circuit. By selecting appropriate delays for the clocks, a circuit designer can configure a logic circuit so that flip-flops in slower paths have their clock edges delayed. This allows time to be borrowed from fast logic paths and provided to slow logic paths, so that the clock speed for the entire circuit need not be slowed to accommodate worst-case delays.

With these conventional time borrowing schemes, it can be difficult to obtain optimal performance due to the limited number of delays that are available from the clock network. Other such schemes for improving timing performance may have limited applicability or require unacceptably complex analysis. For example, time borrowing flip flops have been developed that provide a fixed and relatively small amount of time borrowing. These schemes cannot provide optimal performance in many circuits. Moreover, conventional time borrowing schemes may be prone to problems associated with race conditions and clock timing issues.

It is within this context that the embodiments described herein arise.

SUMMARY

An integrated circuit that includes core logic circuitry surrounded by input-output (IO) circuitry is provided. In accordance with an embodiment, the integrated circuit may include a first clock driver circuit that drives clock signals through a first type of clock distribution network, a second clock driver circuit that drives clock signals through a second type of clock distribution network that is different than the first type of clock distribution network, and at least one clock source that provides clock signals to both the first and second clock driver circuits.

The clock source may be an IO element that receives clock signals from an external oscillator, an on-chip phase-locked loop, or other suitable clock generation circuit. The first type of clock distribution network may cover a first region of the core logic, whereas the second type of clock distribution network may cover a second region of the core logic that is different in size than the first region. The different types of clock distribution networks may include global clock networks that distribute clock signals throughout the entire core logic, regional clock networks that distribute clock signals throughout a quadrant of the core logic, peripheral clock networks that distribute clock signals throughout even a smaller portion of the core logic, etc. Logic circuits formed in an area where the first and second regions overlap may receive skewed clock signals for implementing time borrowing.

The integrated circuit may generally include more than one clock source. In accordance with at least some embodiments, the integrated circuit may also include programmable routing and delay circuitry that is interposed between the clock sources and the different types of clock networks and that is configured to couple the clock sources to at least some of the different types of clock networks in a way such that clock signals routed through the different types of clock networks exhibit the desired clock skews for optimizing circuit performance. The routing the delay circuitry may also include adjustable delay circuits for fine tuning the clock skews.

The logic circuitry on the integrated circuit may include sequential logic circuits having clocked storage elements and combinational logic with data path delays. The clock skews can be adjusted via intelligent physical placement of the clock sources on the integrated circuit based on the data path delays and native delays associated with the different types of clock networks. The clock skews can also be adjusted by intelligently selecting the length of wires connecting the clock sources to the different types of clock networks based on the data path delays and the native delays associated with the different types of clock networks.

Further features of the present invention, its nature and various advantages will be more apparent from the accompanying drawings and the following detailed description.

DETAILED DESCRIPTION

The present invention relates to improving circuit performance in synchronous logic circuits using time borrowing techniques. The logic circuits may be part of any suitable integrated circuits. For example, the logic circuits and time borrowing circuitry of the present invention may be implemented on programmable logic device integrated circuits. If desired, the logic circuits and time borrowing circuitry may be implemented on programmable integrated circuits that are not traditionally referred to as programmable logic devices such as microprocessors containing programmable logic, digital signal processors containing programmable logic, custom integrated circuits containing regions of programmable logic, or other programmable integrated circuits that contain programmable logic. The present invention will generally be described in the context of integrated circuits such as programmable logic device integrated circuits as an example.

It will be recognized by one skilled in the art, that the present exemplary embodiments may be practiced without some or all of these specific details. In other instances, well-known operations have not been described in detail in order not to unnecessarily obscure the present embodiments.

Figure 1:
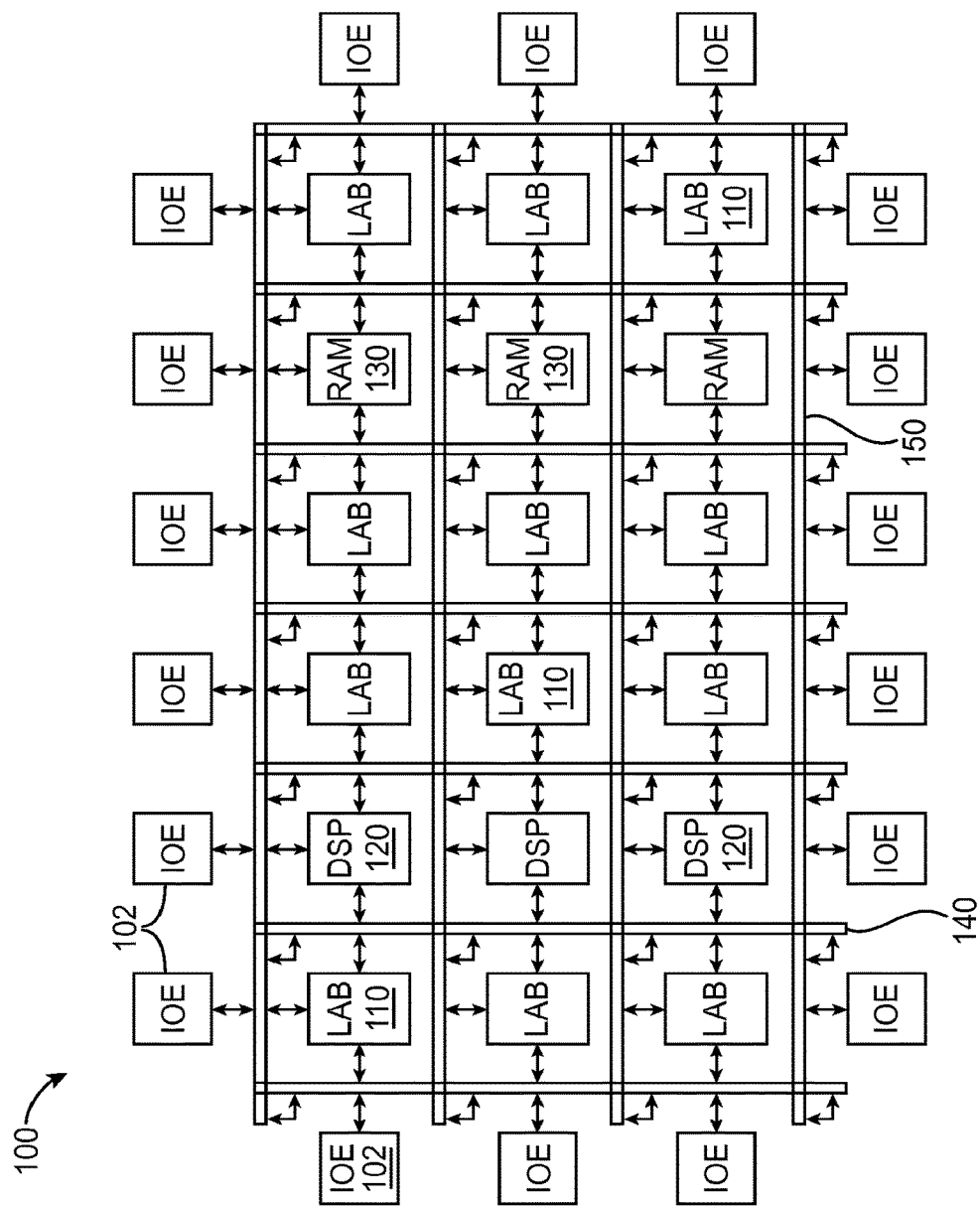
FIG. 1 is a diagram of an illustrative programmable integrated circuit in accordance with an embodiment.

An illustrative integrated circuit such as a programmable logic device (PLD) 10 is shown in FIG. 1. As shown in FIG. 1, PLD 10 may include a two-dimensional array of functional blocks, including logic array blocks (LABs) 110 and other functional blocks, such as random access memory (RAM) blocks 130 and digital signal processing (DSP) blocks 120, for example. Functional blocks such as LABs 110 may include smaller programmable regions (e.g., logic elements, configurable logic blocks, or adaptive logic modules) that receive input signals and perform custom functions on the input signals to produce output signals.

Programmable device 100 may contain programmable memory elements. Memory elements may be loaded with configuration data (also called programming data) using input/output elements (IOEs) 102. Once loaded, the memory elements each provide a corresponding static control signal that controls the operation of an associated functional block (e.g., LABs 110, DSP 120, RAM 130, or input/output elements 102).

In a typical scenario, the outputs of the loaded memory elements are applied to the gates of metal-oxide-semiconductor transistors in a functional block to turn certain transistors on or off and thereby configure the logic in the functional block including the routing paths. Programmable logic circuit elements that may be controlled in this way include parts of multiplexers (e.g., multiplexers used for forming routing paths in interconnect circuits), look-up tables, logic arrays, AND, OR, NAND, and NOR logic gates, pass gates, etc.

The memory elements may use any suitable volatile and/or non-volatile memory structures such as random-access-memory (RAM) cells, fuses, antifuses, programmable read-only-memory memory cells, mask-programmed and laser-programmed structures, combinations of these structures, etc. Because the memory elements are loaded with configuration data during programming, the memory elements are sometimes referred to as configuration memory, configuration RAM (CRAM), or programmable memory elements.

In addition, the programmable logic device may have input/output elements (IOEs) 102 for driving signals off of PLD and for receiving signals from other devices. Input/output elements 102 may include parallel input/output circuitry, serial data transceiver circuitry, differential receiver and transmitter circuitry, or other circuitry used to connect one integrated circuit to another integrated circuit. As shown, input/output elements 102 may be located around the periphery of the chip. If desired, the programmable logic device may have input/output elements 102 arranged in different ways. For example, input/output elements 102 may form one or more columns of input/output elements that may be located anywhere on the programmable logic device (e.g., distributed evenly across the width of the PLD). If desired, input/output elements 102 may form one or more rows of input/output elements (e.g., distributed across the height of the PLD). Alternatively, input/output elements 102 may form islands of input/output elements that may be distributed over the surface of the PLD or clustered in selected areas.

The PLD may also include programmable interconnect circuitry in the form of vertical routing channels 140 (i.e., interconnects formed along a vertical axis of PLD 100) and horizontal routing channels 150 (i.e., interconnects formed along a horizontal axis of PLD 100), each routing channel including at least one track to route at least one wire. If desired, the interconnect circuitry may include pipeline elements, and the contents stored in these pipeline elements may be accessed during operation. For example, a programming circuit may provide read and write access to a pipeline element.

Note that other routing topologies, besides the topology of the interconnect circuitry depicted in FIG. 1, are intended to be included within the scope of the present invention. For example, the routing topology may include wires that travel diagonally or that travel horizontally and vertically along different parts of their extent as well as wires that are perpendicular to the device plane in the case of three dimensional integrated circuits, and the driver of a wire may be located at a different point than one end of a wire. The routing topology may include global wires that span substantially all of PLD 100, fractional global wires such as wires that span part of PLD 100, staggered wires of a particular length, smaller local wires, or any other suitable interconnection resource arrangement.

Furthermore, it should be understood that embodiments may be implemented in any integrated circuit. If desired, the functional blocks of such an integrated circuit may be arranged in more levels or layers in which multiple functional blocks are interconnected to form still larger blocks. Other device arrangements may use functional blocks that are not arranged in rows and columns.

Figure 2:
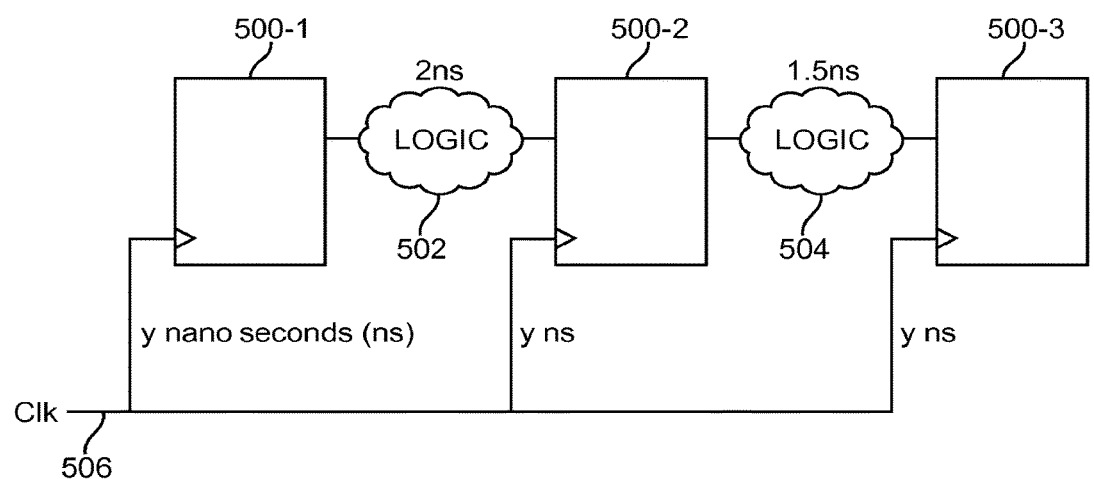
FIG. 2 is a diagram of conventional sequential logic circuitry.

FIG. 2 is a diagram of conventional synchronous logic circuitry that is controlled by a single clock source. As shown in FIG. 2, the synchronous logic circuitry includes a first register 500-1, a second register 500-2, and a third register 500-3. Each of registers 500-1, 500-2, and 500-3 has a control input that receives clock signal Clk via a common path 506. Data output from the first register is fed as an input to the second register via a first combinational logic circuit 502, whereas data output from the second register is fed as an input to the third register via a second combination logic circuit 504.

In the example of FIG. 2, the first combinational logic circuit 500-1 exhibits a propagation delay of 2 nanoseconds (ns), whereas the second combination logic circuit 500-2 exhibits a propagation delay of 1.5 ns. Assuming that each of the three registers receives signal Clk after y nanoseconds of routing delay, the performance of the logic circuitry is limited by the slowest path delay (i.e., the path delay associated with logic 502). In other words, even though register 500-3 can be clocked using a faster clock signal, the performance of the overall chain of registers is constrained by the 2 ns delay interposed between registers 500-1 and 500-2.

Time borrowing schemes have been developed to try to address this problem. For example, time borrowing schemes have been developed in which various delays are provided in the clocks feeding the registers in the synchronous logic circuitry. By selecting appropriate delays for the clocks, a circuit designer can configure a logic circuit so that registers in slower paths have their clock edges delayed. This allows time to be borrowed from fast logic paths and provided to slow logic paths, so that the clock speed for the entire circuit need not be slowed to accommodate worst-case delays.

With these conventional time borrowing schemes, it can be difficult to obtain optimal performance due to the limited number of delays that are available from the clock network. Oftentimes, clock networks on an integrated circuit die can only be driven at one of several input pins that are equidistant to the center of the die. For example, an integrated circuit die may have global clock networks that can only be driven using IO pins positioned along the center at opposing edges of the die. This limitation severely limits the flexibility of the time borrowing. Adding more IO pins for receiving external clock signals or clock generation circuits such as phase-locked loops for generating clock signals on-chip at different locations can help provide extra flexibility. However, the use of additional IO clock pins or on-chip clock generation circuits substantially increases power consumption and takes up valuable area on the integrated circuit.

Figure 3:
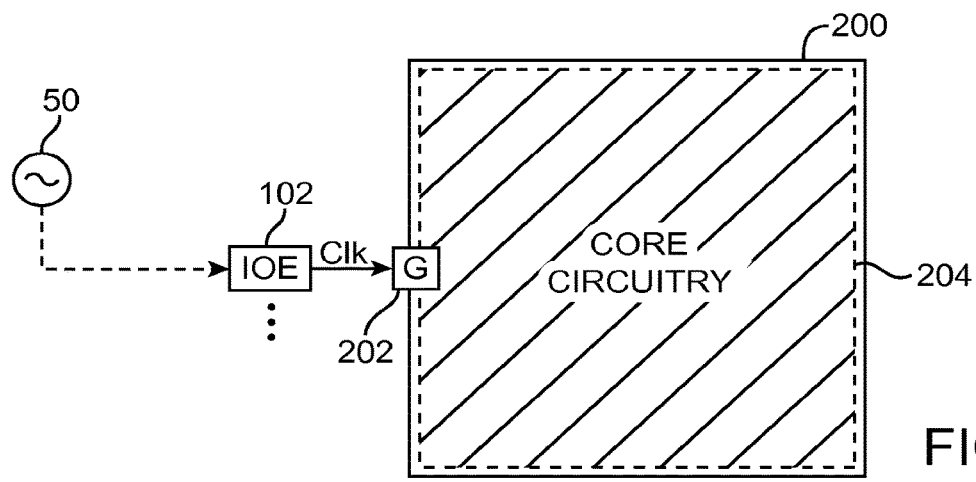
FIG. 3 is a diagram of an illustrative global clock network that can be used to route clock signals throughout core circuitry within an integrated circuit in accordance with an embodiment.

In accordance with an embodiment, a programmable integrated circuit may be provided with different types of clock networks that serve to distribute clock signals to different portions of the integrated circuit. FIG. 3 shows an arrangement in which an IO element 102 receives a clock signal Clk generated from an off-chip crystal oscillator 50 (as an example). This is merely illustrative and does not serve to limit the scope of the present invention. If desired, the clock signal may be generated using one or more phase-locked loop (PLL) circuits or other suitable clock generation circuitry on the integrated circuit.

In the configuration of FIG. 3, signal Clk may be fed from IO element 102 (or other suitable clock source) to a first type of clock network driver 202. Clock network driver 202 may serve to drive the Clk signal to at least some region of core circuitry 200 on the integrated circuit. Core circuitry 200 may include storage and processing circuitry such as embedded microprocessors, digital signal processors (e.g., DSPs 120 of FIG. 1), arithmetic circuitry, logic circuitry (e.g., logic array blocks 110 of FIG. 1), microcontrollers, or other processing circuitry, random-access memory (e.g., RAM 130 of FIG. 1), first-in first-out (FIFO) circuitry, stack or last-in first-out (LIFO) circuitry, read-only memory (ROM), or other memory elements. Core circuitry 200 that includes logic circuitry may sometimes be referred to as core logic circuitry. In general, core logic 200 may be powered using a relatively low power supply voltage Vcc (sometimes referred to as a nominal power supply voltage or a core power supply voltage). Using a low power supply voltage in the core logic helps to reduce power consumption.

Core logic 200 is generally located in the center of an integrated circuit and is surrounded by the input-output circuitry. The input-output circuitry (e.g., the IO elements 102 of FIG. 1) may be powered using a relative larger power supply voltage Vccn (i.e., Vccn may be greater than Vcc). Use of the larger power supply voltage Vccn ensures that input and output drivers in input-output elements 102 are able to communicate properly with external circuitry. As an example, the power supply voltage Vccn allows output drivers to transmit outgoing data signals at voltage levels that are compliant with commonly used communications standards. These standards may require the use of relatively large signal voltages to increase noise immunity on circuit board busses. If only lower voltages such as Vcc were available to power the input-output drivers, it might be difficult or impossible to interface with other integrated circuits.

In the arrangement of FIG. 3, clock network driver 202 of the first type may be used to drive clock signals throughout the entire core logic (as indicated by shaded region 204) via a corresponding "global" (G) clock distribution network. Driver 202 may therefore sometimes be described to herein as a global clock network driver. The clock distribution network may form a structure (e.g., a tree structure such as an H-tree structure) that distributes clock signals evenly to different respective portions of region 204. An H-tree type clock distribution network can help ensure the clock delays to different points in the core logic are well matched.

Figure 4:
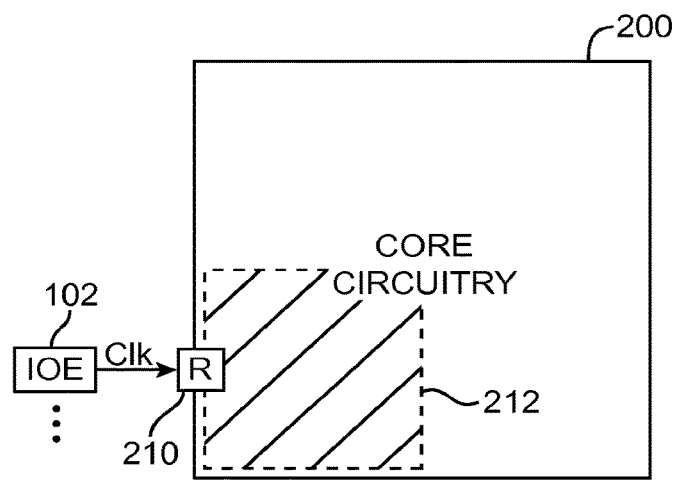
FIG. 4 is a diagram of an illustrative regional clock network that can be used to route clock signals to a portion of core circuitry within an integrated circuit in accordance with an embodiment.

In another suitable arrangement, signal Clk may be fed from an IO element 102 (or other suitable on-chip or off-chip clock source) to a second type of clock network driver 210 (see, e.g., FIG. 4). As shown in FIG. 4, clock network driver 210 may be used to drive clock signals to a given quadrant of the integrated circuit (as indicated by shaded region 212) via a "regional" (R) clock distribution network. Driver 210 may therefore sometimes be described to herein as a regional clock network driver. The example of FIG. 4 in which driver 210 routes clock signals to the bottom left quadrant of core logic 200 is merely illustrative. In general, device 100 (of FIG. 1) may include clock sources that feed clock signals to regional clock drivers that route clock signals to the top left quadrant, to the top right quadrant, and/or to the bottom right quadrant of the core logic.

In yet another suitable arrangement, signal Clk may be fed from an IO element 102 (or other suitable on-chip or off-chip clock source) to a third type of clock network driver 220

Figure 5:
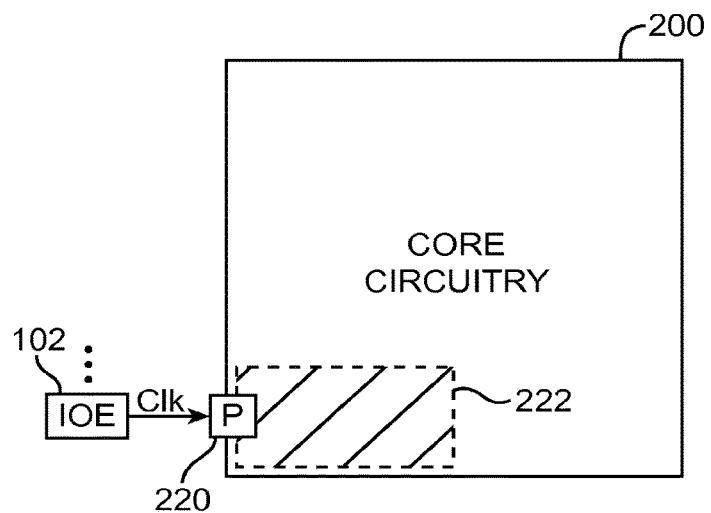
FIG. 5 is a diagram of an illustrative peripheral clock network that can be used to route clock signals to an even smaller portion of the core circuitry in accordance with an embodiment.

(see, e.g., FIG. 5). As shown in FIG. 5, clock network driver 220 may be used to drive clock signals to a partial region covering only an eight of the core logic (as indicated by shaded region 222) via a "peripheral" (P) clock distribution network. Driver 220 may therefore sometimes be described to herein as a periphery clock network driver. The example of FIG. 5 in which driver 210 routes clock signals to the bottom left octant of core logic 200 is merely illustrative. In general, device 100 (of FIG. 1) may include clock sources that feed clock signals to peripheral clock drivers that route clock signals to different respective octants of the core logic.

The three different types of "levels" of clock distribution networks described in connection with FIGS. 3-5 are merely illustrative and do not serve to limit the scope of the present invention. If desired, any number of types of clock distribution networks may be used to provide clock signals to different portions of the core logic (e.g., at least two different levels of clock distribution networks, more than three different types of clock distribution networks, or more than four different types of clock distribution networks may be used for routing clock signals to different portions of the integrated circuit).

In general, the different types of clock distribution networks may exhibit different amounts of clock delays (i.e., the amount of time it takes for the clock signal to be routed from the clock driver circuit to the intended destination in the core logic region). Clock networks covering a wider region on the integrated circuit typically exhibit greater delays since more levels of routing and buffering may be required to properly drive the clock signals to disparate locations on the device. For example, clock signals driven by clock driver 202 through a global clock tree may experience a 1.5 ns propagation delay before reaching the intended register in the core logic; clock signals driven by clock driver 210 through a regional clock tree may experience a 1.0 ns propagation delay before reaching the intended register in the core logic; whereas clock signals driven by clock driver 220 through a peripheral clock tree may experience a 0.5 ns propagation delay before reaching the intended register in the core logic. This example is merely illustrative. As another example, the global clock network, the regional clock network, and the peripheral clock network may have clock delays of 1.1 ns, 0.8 ns, and 0.3 ns, respectively. In yet other suitable arrangements, clock networks covering wider regions on the integrated circuit may exhibit lesser delays relative to clock networks serving smaller regions.

Figure 6A:
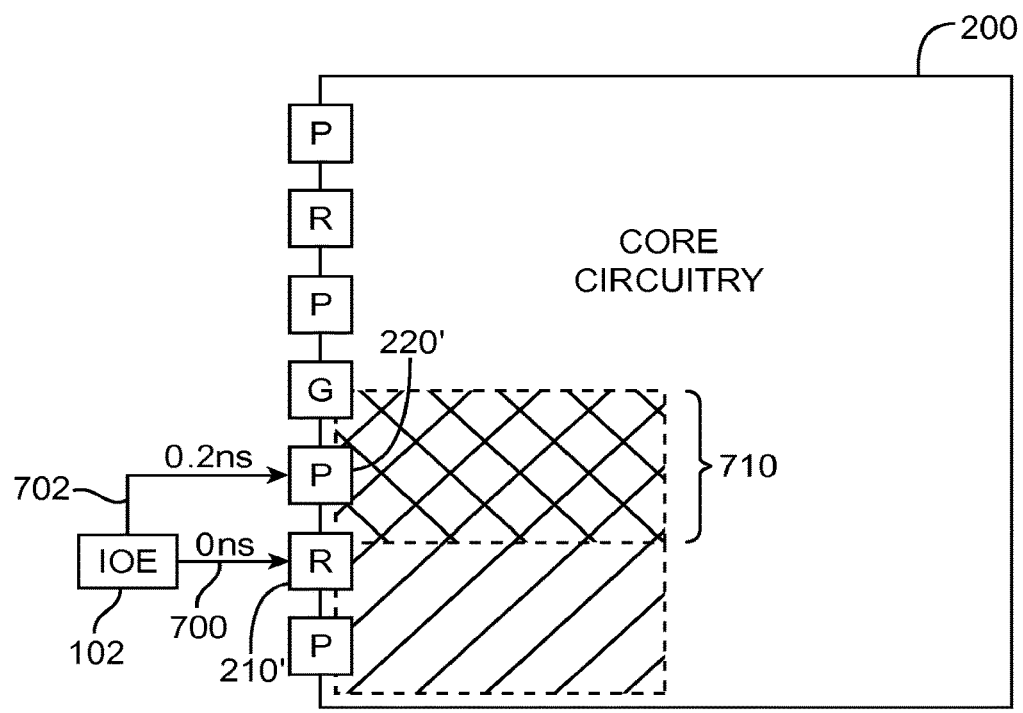
FIGS. 6A and 6B are diagrams showing how placement of an input-output (IO) clock source can adjust clock skew in accordance with an embodiment.
Figure 6B:
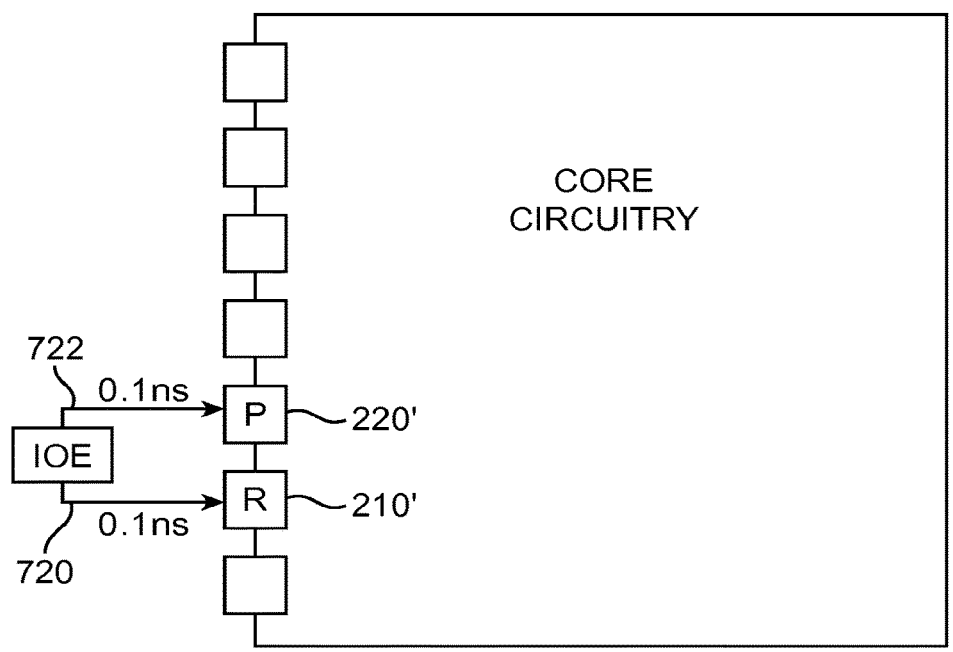

In additional to the clock delays associated with each of the different type of clock distribution networks (e.g., the different amounts of clock delays described in connection with FIGS. 3-5), the physical placement of the clock source relative to the location of each clock driver circuit can also affect the overall propagation delay. FIGS. 6A and 6B are diagrams showing how the location of an IO element 102 on an integrated circuit can impact the overall clock delay.

In the example of FIG. 6A, the IO element 102 routes clock signals to a regional clock distribution network via a regional clock driver 210' and to a peripheral clock distribution network via a peripheral clock driver 220'. As shown in FIG. 6A, element 102 is placed closer to driver 210' and further away from driver 220'. As a result, a routing path 700 connecting element 102 to driver 210' may exhibit negligible wire delay (e.g., zero ns delay), whereas the routing path 702 connecting element 102 to driver 220' may introduce a non-negligible wire delay of 0.2 ns (as an example). Delay is typically a linear function of distance. Path 702 may therefore have a length that is greater than that of path 700.

Assuming, for example, that the regional and peripheral clock distribution networks have associated clock delays of 1.0 ns and 0.5 ns, respectively. Configured in this way, clock signals that originate from IO element 102 and that are fed to logic circuits via the regional clock distribution network may experience an overall propagation delay of 1.0 ns (i.e., the sum of the 1.0 ns inherent regional clock network delay with the negligible wire delay). On the other hand, clock signals that originate from IO element 102 and that are fed to logic circuits via the peripheral clock distribution network may experience an overall propagation delay of 0.7 ns (i.e., the sum of the 0.5 ns inherent periphery clock network delay with the 0.2 ns wire delay). In this particular example, clock signals that are fed to core logic circuits via the regional clock network may therefore exhibit a 0.3 ns clock skew (i.e., 1.0 ns minus 0.7 ns) relative to clock signals that are fed to core logic circuits via the peripheral clock network. As illustrated in this scenario, the amount of clock skew may be determined by computing the difference between the overall clock delay from the clock source to the logic circuits via one clock tree network and the overall clock delay from the clock source to the logic circuits via another clock tree network.

In accordance with an embodiment, clock skew generated in this way can be leveraged to apply time borrowing for sequential logic circuits. Time borrowing schemes implemented in this way may be applied to neighboring logic circuits such as registers and latches formed within an intersection of the regions covered by the different clock networks. In the arrangement of FIG. 6A, logic circuits residing in the intersecting region served by the regional clock network and the periphery clock network (as indicated by the overlapping area 710) may benefit from time borrowing schemes that rely on clock skews generated based on differences in the overall clock delays associated with varying paths through which the clock signals can be routed.

Figure 7:
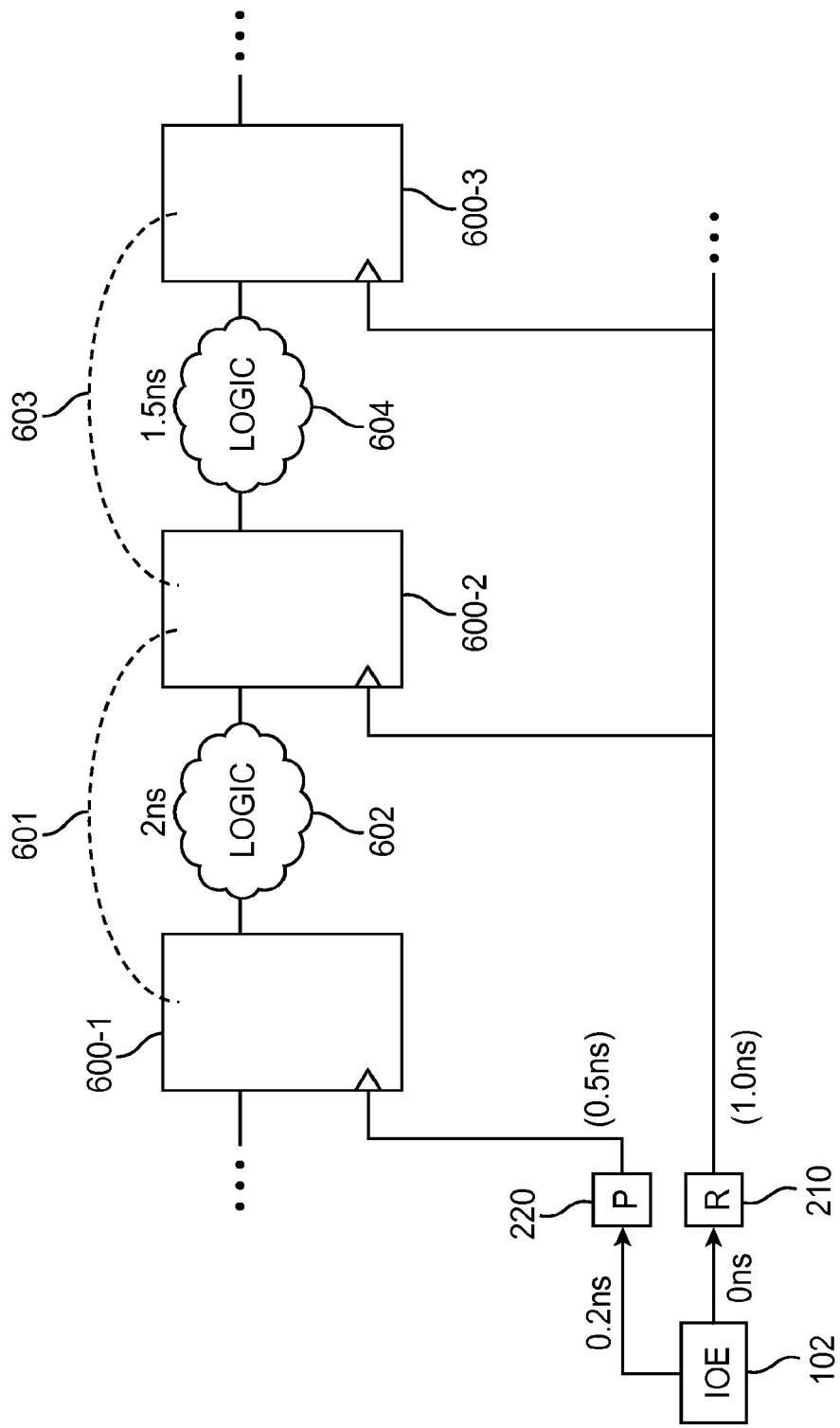
FIG. 7 illustrates an exemplary timing borrowing scheme in which sequential logic circuitry is provided with different clock signals exhibiting desired skews in accordance with an embodiment.

An example illustrating how a 0.3 ns clock skew can be used for implementing time borrowing is shown in FIG. 7. FIG. 7 shows logic circuitry that includes a first latching circuit 600-1, a second latching circuit 600-2, a third latching circuit 600-3, a combinatorial logic circuit 602 interposed between the first and second latching circuits, and a combinatorial logic circuit 604 interposed between the second and third latching circuits. Latching circuits 600 (i.e., circuits 600-1, 600-2, and 600-3) may be clocked storage elements such as edge-triggered latches (e.g., flip-flops or registers) or level-sensitive latches (e.g., pulsed latches).

As shown in FIG. 7, latch 600-1 may receive a clock signal from clock source 102 via a peripheral clock network driver 220, whereas latches 600-2 and 600-3 receive clock signals from clock source 102 via a regional clock network driver 210. Clock signals received at latch 600-1 may experience a overall propagation delay of 0.7 ns (i.e., a 0.2 ns clock routing delay and a 0.5 ns peripheral clock network delay), whereas clock signals received at latches 600-2 and 600-3 may experience overall propagation delays of 1.0 ns (i.e., a 0 ns clock routing delay and a 1.0 ns regional clock network delay), thereby resulting in a 0.3 ns (1.0 ns-0.7 ns) clock skew as described above.

Assume in the example of FIG. 7 that combinational logic circuit 602 exhibits a data path delay of 2 ns and that logic circuit 604 exhibits a data path delay of 1.5 ns. In conventional non-time-borrowing schemes in which each latching circuit receives clock signals lacking any deliberate clock skew, the operation of the sequential logic would be limited by the 2 ns critical path delay.

In general, the minimum required clock period for two successive latching circuits to latch data properly may be determined by subtracting a destination clock delay from the sum of a source clock delay and the combinational logic propagation delay. Consider for example that a first latching circuit generates an output signal that is intended for a second latching circuit, where the output signal is fed through an associated combinational logic circuit before arriving at the second latching circuit. The combinational logic propagation delay may represent the amount of delay that exists between the first and second latching circuits (i.e., data being output from the first latching circuit may experience a predictable amount of delay when propagating through the combination logic circuit before arriving at the second latching circuit). The source clock delay may represent an amount of delay that a clock signal experiences after being generated by a clock source and before arriving at the first latching circuit. The destination clock delay may represent an amount of delay that a clock signal experiences after being output by the clock source and before arriving at the second latching circuit. The clock signal arriving at the first latching circuit is sometimes referred to as the "arrival" clock, whereas the clock signal arriving at the second latching circuit is sometimes referred to as the "required" clock.

Referring again to the example of FIG. 7, the minimum clock period that is required for data to be successfully transferred from latch 600-1 to latch 600-2 (as indicated by path 601) may be computed by subtracting 1.0 ns from the sum of 0.7 ns and 2 ns, which results in a minimum required clock period of 1.7 ns. The minimum clock period that is required for data to be successfully transferred from latch 600-2 to latch 600-3 (as indicated by path 603) may be computed by subtracting 1.0 ns from the sum of 1.0 ns and 1.5 ns, which results in a minimum required clock period of 1.5 ns. The operation of this setup has therefore been reduced from the 2 ns clock period in the conventional clock scheme to 1.7 ns when the 0.3 ns clock skew has been intentionally used to implement time borrowing (e.g., by using slower clocks to latch the destination latch of the slowest data path). When latches in slower paths have their clock edges delayed, time can be borrowed from fast logic paths and provided to slow logic paths in a way that the clock speed for the entire circuit need not be slowed to accommodate worst-case delays.

As shown in the example of FIG. 7, the amount of clock skew can be intelligently leveraged to help improve the performance of the core logic circuitry. The setup of FIG. 7 can, for example, be further optimized if the clock skew between the peripheral and regional clocks were adjusted to 0.5 ns instead of 0.3 ns. One way of doing so would be to change the clock routing delay between IO element 102 to peripheral clock network 220 and regional clock network 210 to both be equal to 0.1 ns (instead of 0.2 ns and 0 ns, respectively, as shown in the example of FIG. 7).

Assuming this new arrangement, the minimum clock period that is required for data to be successfully transferred from latch 600-1 to latch 600-2 (as indicated by path 601) may be computed by subtracting 1.1 ns (i.e., the sum of the 0.1 ns clock routing delay and a 1 ns regional clock network delay) from the sum of 0.6 ns (i.e., the sum of the 0.1 ns clock routing delay and a 0.5 ns peripheral clock network delay) and 2 ns, which results in a minimum required clock period of 1.5 ns. The minimum clock period that is required for data to be successfully transferred from latch 600-2 to latch 600-3 (as indicated by path 603) may be computed by subtracting 1.1 ns from the sum of 1.1 ns and 1.5 ns, which results in a minimum required clock period of 1.5 ns. The operation of this setup has therefore been further reduced from a minimum required clock period of 1.7 ns to 1.5 ns using an optimized clock skew of 0.5 ns.

It may therefore be desirable to be able to provide ways for selectively adjusting clock skews. As described above, the physical placement of the clock source can affect the amount of clock skew. Referring now to the example of FIG. 6B, the IO element 102 is positioned equidistant to both drivers 210' and 220'. As a result, a routing path 720 connecting element 102 to driver 210' and routing path 722 connecting element 102 to driver 220' may introduce an equal amount of wire delay (e.g., a delay of 0.1 ns). As shown in FIG. 6B, paths 720 and 722 may have identical lengths (as an example). In other suitable embodiments, the width of the wires and/or the resistance of the wires can be altered to adjust the relative path delays.

Assuming, for example, that the regional and peripheral clock distribution networks have associated clock delays of 1.0 ns and 0.5 ns, respectively. Configured in this way, clock signals that originate from IO element 102 and that are fed to logic circuits via the regional clock distribution network may experience an overall propagation delay of 1.1 ns (i.e., the sum of the 1.0 ns inherent regional clock network delay with the 0.1 ns wire delay). On the other hand, clock signals that originate from IO element 102 and that are fed to logic circuits via the peripheral clock distribution network may experience an overall propagation delay of 0.6 ns (i.e., the sum of the 0.5 ns inherent periphery clock network delay with the 0.1 ns wire delay). In this particular example, clock signals that are fed to core logic circuits via the regional clock network may therefore exhibit a 0.5 ns clock skew (i.e., 1.1 ns minus 0.6 ns) relative to clock signals that are fed to core logic circuits via the peripheral clock network.

Figure 8A:
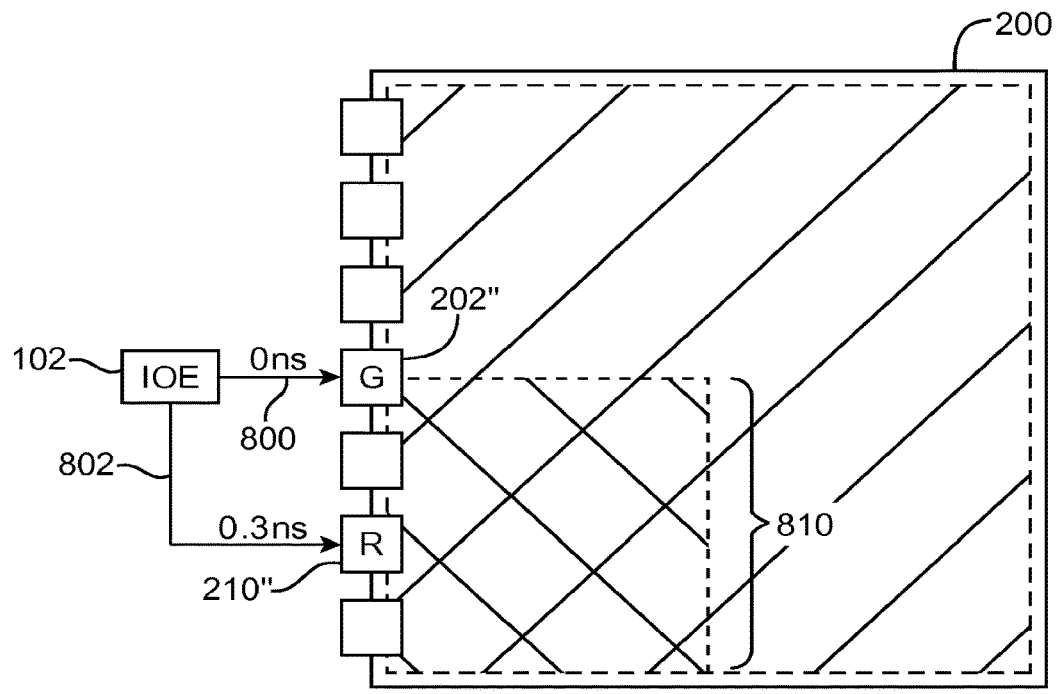
FIGS. 8A and 8B are diagrams showing how different clock routing arrangements from a given IO clock source can adjust clock skew in accordance with an embodiment.
Figure 8B:
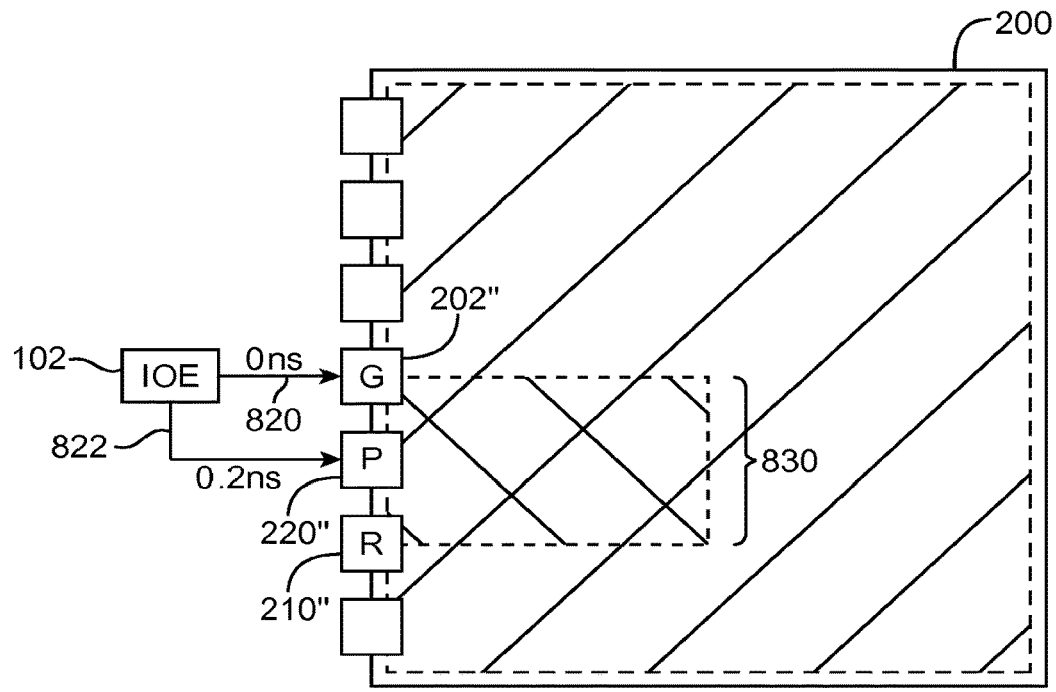

As shown in FIG. 1, many IO elements 102 can be formed along each edge of integrated circuit 100. The examples of FIGS. 6A and 6B illustrates how the clock source placement can be leveraged to achieve the desired clock phase relationship. In another suitable embodiment, intelligent clock routing between the clock source and the clock networks can also be leveraged to achieve the desired clock skew relationship. FIGS. 8A and 8B are diagrams showing how different clock routing arrangements from a given IO clock source can also adjust clock skew.

In the example of FIG. 8A, the clock source 102 is routed to a nearby global clock driver 202" and to a regional clock driver 210" that is further away. As a result, a routing path 800 connecting element 102 to driver 202" may exhibit negligible wire delay (e.g., zero ns delay), whereas the routing path 802 connecting element 102 to driver 210" may introduce a non-negligible wire delay of 0.3 ns (as an example).

Assuming, for example, that the regional and peripheral clock distribution networks have associated clock delays of 1.0 ns and 0.5 ns, respectively. Configured in this way, clock signals that originate from IO element 102 and that are fed to logic circuits via the regional clock distribution network may experience an overall propagation delay of 1.5 ns (i.e., the sum of the 1.5 ns inherent global clock network delay with the negligible wire delay). On the other hand, clock signals that originate from IO element 102 and that are fed to logic circuits via the regional clock distribution network may experience an overall propagation delay of 1.3 ns (i.e., the sum of the 1.0 ns inherent regional clock network delay with the 0.3 ns wire delay). In this particular example, clock signals that are fed to core logic circuits via the global clock network may therefore exhibit a 0.2 ns clock skew (i.e., 1.5 ns minus 1.3 ns) relative to clock signals that are fed to core logic circuits via the regional clock network.

In the arrangement of FIG. 8A, logic circuits residing in the intersecting region served by the global clock network and the regional clock network (as indicated by the overlapping area 810) may benefit from time borrowing schemes that rely on clock skews generated in this way.

If desired, the setup of FIG. 8A may be configured differently to obtain an adjusted clock skew by simply rerouting the clock source 102 to a closer peripheral clock network driver 220″ instead of being coupled to driver 210″. As a result, a routing path 820 connecting element 102 to driver 202″ may exhibit negligible wire delay (e.g., zero ns delay), whereas the routing path 822 connecting element 102 to driver 220″ may introduce a smaller wire delay of 0.2 ns (as an example).

Assume again that the regional and peripheral clock distribution networks have associated clock delays of 1.0 ns and 0.5 ns, respectively. Configured in this way, clock signals that originate from IO element 102 and that are fed to logic circuits via the global clock distribution network may similarly experience an overall propagation delay of 1.5 ns. On the other hand, clock signals that originate from IO element 102 and that are fed to logic circuits via the peripheral clock distribution network may experience an overall propagation delay of 0.7 ns (i.e., the sum of the 0.5 ns inherent periphery clock network delay with the 0.2 ns wire delay). In this particular example, clock signals that are fed to core logic circuits via the global clock network may therefore exhibit a 0.8 ns clock skew (i.e., 1.5 ns minus 0.7 ns) relative to clock signals that are fed to core logic circuits via the peripheral clock network.

In the arrangement of FIG. 8B, logic circuits residing in the intersecting region served by the global clock network and the peripheral clock network (as indicated by the overlapping area 830) may benefit from time borrowing schemes that rely on clock skews generated in this way.

Figure 9:
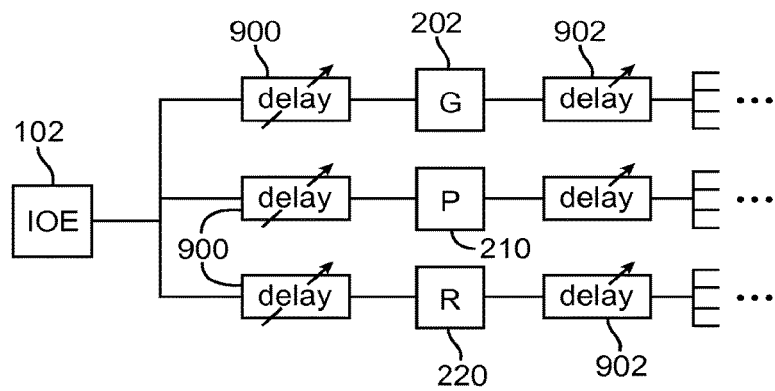
FIG. 9 is a diagram showing adjustable delay elements that can be inserted into one or more clock routing paths to help achieve the desired clock skew in accordance with an embodiment.

In yet other suitable embodiments, additional delay circuits may be inserted in the clock paths for further fine-tuning of the clock skews (see, e.g., FIG. 9). As shown in FIG. 9, delay circuits 900 may optionally be interposed between the clock source and the respective clock network drivers, whereas delay circuits 902 may optionally be inserted after the clock network drivers and before the first bifurcation of the associated tree structures. Delay circuits 900 and 902 may be adjusted to help tune the various clock skews to achieve optimal circuit performance.

Figure 10:
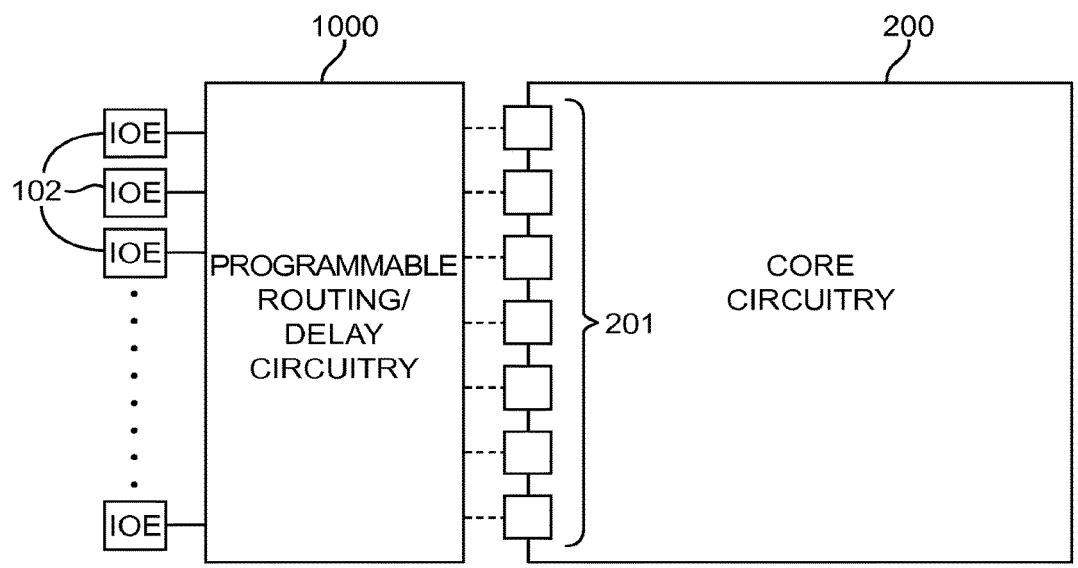
FIG. 10 is a diagram showing programmable routing and delay circuitry that can be configured to provide logic circuits in the core circuitry with the optimal time borrowing arrangement in accordance with an embodiment.

In accordance with embodiments of the present invention, intelligent IO placement (described above in connection with FIGS. 6A and 6B) and intelligent clock routing (described above in connection with FIGS. 8A and 8B) may be used to help achieve the desired clock phase relationship. FIG. 10 illustrates use of programmable routing and delay circuitry 1000 that can be inserted between the IO clock sources and the clock network drivers to help provide maximum flexibility in the choice of IO placement and clock routing.

Circuitry 1000 can be configured to route clock signals from any one of IO elements 102 to any selected portion of the column of clock network drivers 201. By selecting which IO elements are active, the physical placement of the clock sources can first be determined. By selecting how the active IO elements are being routed to the various types of clock networks, the additional wire routing delays can then be determined. Circuitry 1000 may also include adjustable delay circuits 900 of the type described in connection with FIG. 9.

The example of FIG. 10 in which clock sources are being routed to clock network drivers formed along one edge of the core circuitry 200 is merely illustrative and is not intended to limit the scope of the present invention. If desired, clock drivers may be formed along any number of edges of the integrated circuit (e.g., along two edges, along three edges, or along all four edges), and programmable routing/delay circuitry 1000 may be formed neighboring the different groups of clock drivers to help adjust and optimize clock skew. In yet other suitable embodiments, the routing/delay circuitry 1000 linking the clock sources to the clock networks 201 may be non-programmable/non-reconfigurable circuits that provide fixed delays and fixed clock skews. When circuitry 1000 is non-programmable, intelligent placement of the clock sources and routing of the clock signals to achieve the desired clock skew may be even more critical.

Figure 11:
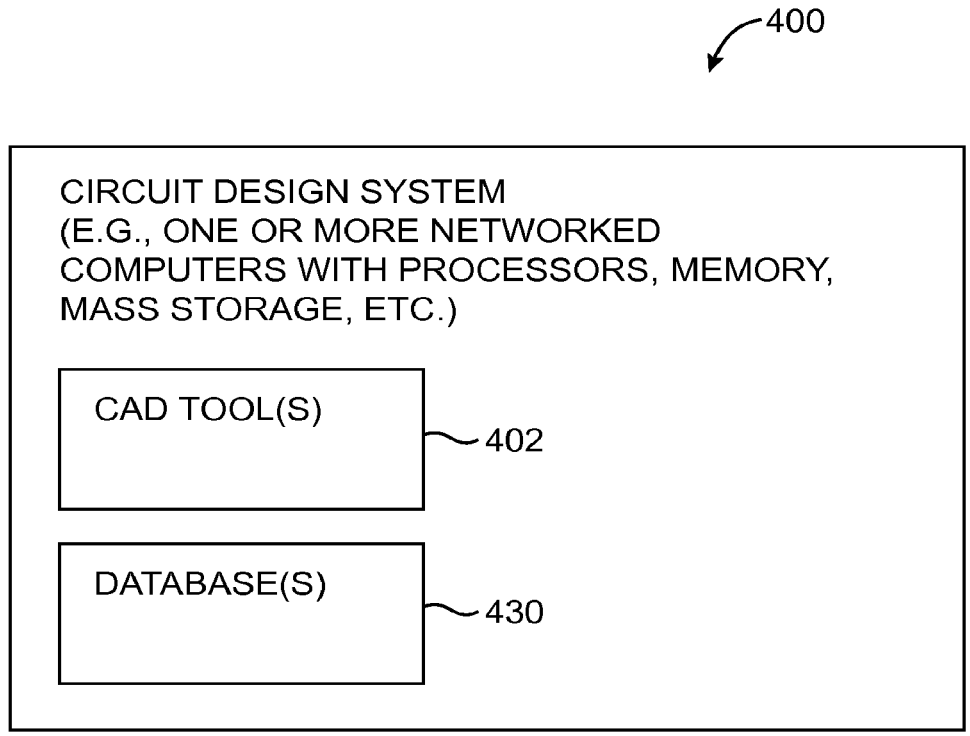
FIG. 11 is a diagram of an illustrative circuit design system that may be used to design integrated circuits in accordance with an embodiment.

In accordance with another suitable embodiment, integrated circuit design tools can be used to run an algorithm that analyzes a particular logic design and to make or recommend IO placements and clock routing strategies for optimizing circuit performance. An illustrative circuit design system 400 in accordance with the present invention is shown in FIG. 11. System 400 may be based on one or more processors such as personal computers, workstations, etc. The processor(s) may be linked using a network (e.g., a local or wide area network). Memory in these computers or external memory and storage devices such as internal and/or external hard disks may be used to store instructions and data.

Software-based components such as computer-aided design tools 420 and databases 430 reside on system 400. During operation, executable software such as the software of computer aided design tools 420 runs on the processor(s) of system 400. Databases 430 are used to store data for the operation of system 400. In general, software and data may be stored on any computer-readable medium (storage) in system 400. Such storage may include computer memory chips, removable and fixed media such as hard disk drives, flash memory, compact discs (CDs), digital versatile discs (DVDs), blu-ray discs (BDs), other optical media, and floppy diskettes, tapes, or any other suitable memory or storage device(s). When the software of system 400 is installed, the storage of system 400 has instructions and data that cause the computing equipment in system 400 to execute various methods (processes). When performing these processes, the computing equipment is configured to implement the functions of the circuit design system.

The computer aided design (CAD) tools 420, some or all of which are sometimes referred to collectively as a CAD tool or an electronic design automation (EDA) tool, may be provided by a single vendor or by multiple vendors. Tools 420 may be provided as one or more suites of tools (e.g., a compiler suite for performing tasks associated with implementing a circuit design in a programmable logic device) and/or as one or more separate software components (tools). Database(s) 430 may include one or more databases that are accessed only by a particular tool or tools and may include one or more shared databases. Shared databases may be accessed by multiple tools. For example, a first tool may store data for a second tool in a shared database. The second tool may access the shared database to retrieve the data stored by the first tool. This allows one tool to pass information to another tool. Tools may also pass information between each other without storing information in a shared database if desired.

Figure 12:
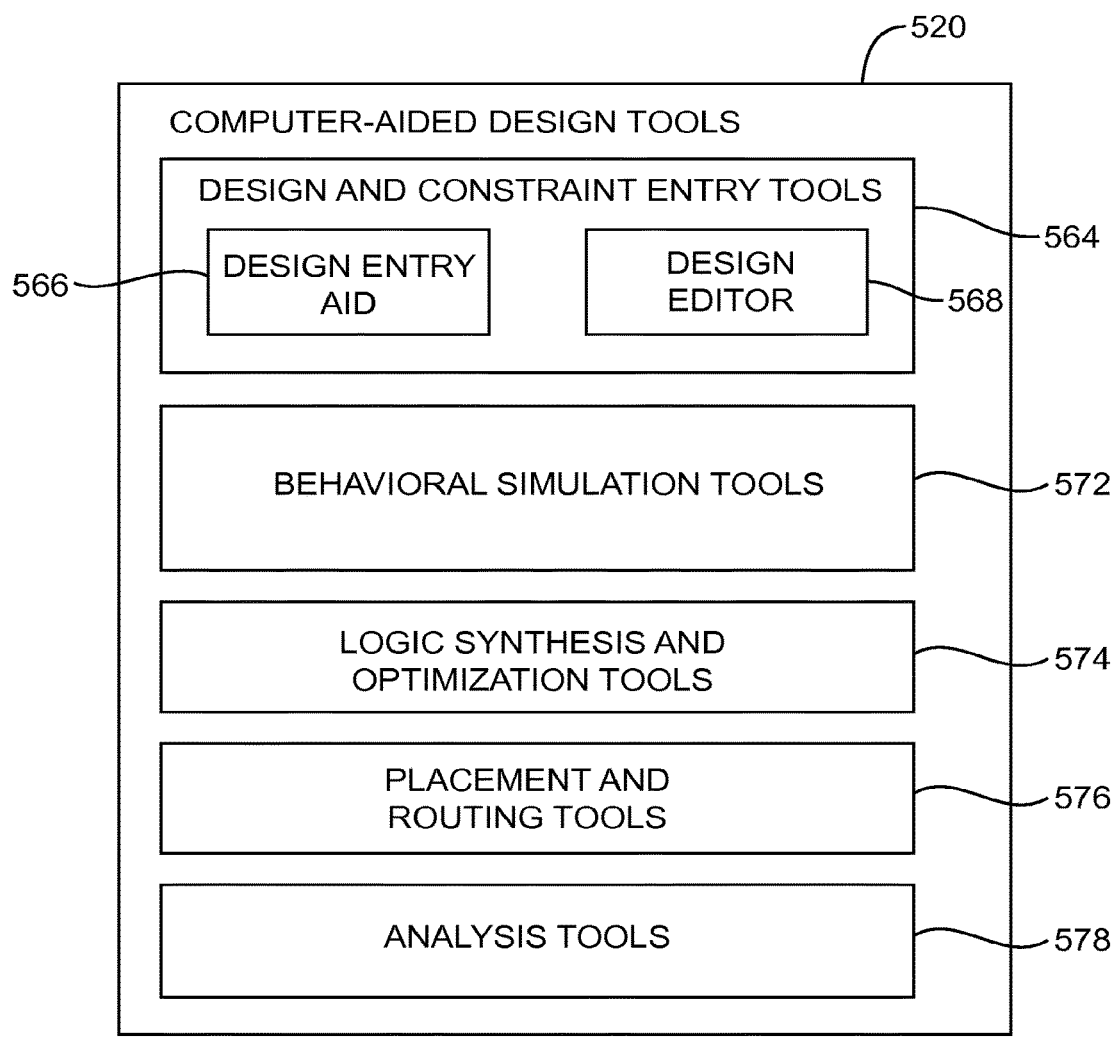
FIG. 12 is a diagram of illustrative computer-aided design (CAD) tools that may be used in a circuit design system in accordance with an embodiment.

Illustrative computer aided design tools 520 that may be used in a circuit design system such as circuit design system 400 of FIG. 11 are shown in FIG. 12.

The design process may start with the formulation of functional specifications of the integrated circuit design (e.g., a functional or behavioral description of the integrated circuit design). A circuit designer may specify the functional operation of a desired circuit design using design and constraint entry tools 564. Design and constraint entry tools 564 may include tools such as design and constraint entry aid 566 and design editor 568. Design and constraint entry aids such as aid 566 may be used to help a circuit designer locate a desired design from a library of existing circuit designs and may provide computer-aided assistance to the circuit designer for entering (specifying) the desired circuit design.

As an example, design and constraint entry aid 566 may be used to present screens of options for a user. The user may click on on-screen options to select whether the circuit being designed should have certain features. Design editor 568 may be used to enter a design (e.g., by entering lines of hardware description language code), may be used to edit a design obtained from a library (e.g., using a design and constraint entry aid), or may assist a user in selecting and editing appropriate prepackaged code/designs.

Design and constraint entry tools 564 may be used to allow a circuit designer to provide a desired circuit design using any suitable format. For example, design and constraint entry tools 564 may include tools that allow the circuit designer to enter a circuit design using truth tables. Truth tables may be specified using text files or timing diagrams and may be imported from a library. Truth table circuit design and constraint entry may be used for a portion of a large circuit or for an entire circuit.

As another example, design and constraint entry tools 564 may include a schematic capture tool. A schematic capture tool may allow the circuit designer to visually construct integrated circuit designs from constituent parts such as logic gates and groups of logic gates. Libraries of preexisting integrated circuit designs may be used to allow a desired portion of a design to be imported with the schematic capture tools.

If desired, design and constraint entry tools 564 may allow the circuit designer to provide a circuit design to the circuit design system 400 using a hardware description language such as Verilog hardware description language (Verilog HDL), Very High Speed Integrated Circuit Hardware Description Language (VHDL), SystemVerilog, or a higher-level circuit description language such as OpenCL or SystemC, just to name a few. The designer of the integrated circuit design can enter the circuit design by writing hardware description language code with editor 568. Blocks of code may be imported from user-maintained or commercial libraries if desired.

After the design has been entered using design and constraint entry tools 564, behavioral simulation tools 572 may be used to simulate the functional performance of the circuit design. If the functional performance of the design is incomplete or incorrect, the circuit designer can make changes to the circuit design using design and constraint entry tools 564. The functional operation of the new circuit design may be verified using behavioral simulation tools 572 before synthesis operations have been performed using tools 574. Simulation tools such as behavioral simulation tools 572 may also be used at other stages in the design flow if desired (e.g., after logic synthesis). The output of the behavioral simulation tools 572 may be provided to the circuit designer in any suitable format (e.g., truth tables, timing diagrams, etc.).

Once the functional operation of the circuit design has been determined to be satisfactory, logic synthesis and optimization tools 574 may generate a gate-level netlist of the circuit design, for example using gates from a particular library pertaining to a targeted process supported by a foundry, which has been selected to produce the integrated circuit. Alternatively, logic synthesis and optimization tools 574 may generate a gate-level netlist of the circuit design using gates of a targeted programmable logic device (i.e., in the logic and interconnect resources of a particular programmable logic device product or product family).

Logic synthesis and optimization tools 574 may optimize the design by making appropriate selections of hardware to implement different logic functions in the circuit design based on the circuit design data and constraint data entered by the logic designer using tools 564.

After logic synthesis and optimization using tools 574, the circuit design system may use tools such as placement and routing tools 576 to perform physical design steps (layout synthesis operations). Placement and routing tools 576 are used to determine where to place each gate of the gate-level netlist produced by tools 574. For example, if two counters interact with each other, the placement and routing tools 576 may locate these counters in adjacent regions to reduce interconnect delays or to satisfy timing requirements specifying the maximum permitted interconnect delay. The placement and routing tools 576 create orderly and efficient implementations of circuit designs for any targeted integrated circuit (e.g., for a given programmable integrated circuit such as a field-programmable gate array (FPGA)).

Tools such as tools 574 and 576 may be part of a compiler suite (e.g., part of a suite of compiler tools provided by a programmable logic device vendor). In accordance with the present invention, tools such as tools 574, 576, and 578 may also include timing analysis tools such as timing estimators. This allows tools 574 and 576 to satisfy performance requirements (e.g., timing requirements) before actually producing the integrated circuit. As an example, tools 574 and 576 may partition data paths into subsets of data paths and instantiate additional cascaded processing and storage circuitry for each newly created subset of data paths. If desired, tools 574 and 576 may register pipeline selected paths in order to provide for higher clock rates in exchange for increased latency.

After an implementation of the desired circuit design has been generated using placement and routing tools 576 the implementation of the design may be analyzed and tested using analysis tools 578. After satisfactory optimization operations have been completed using tools 520 and depending on the targeted integrated circuit technology, tools 520 may produce a mask-level layout description of the integrated circuit or configuration data for programming the programmable logic device.

Figure 13:
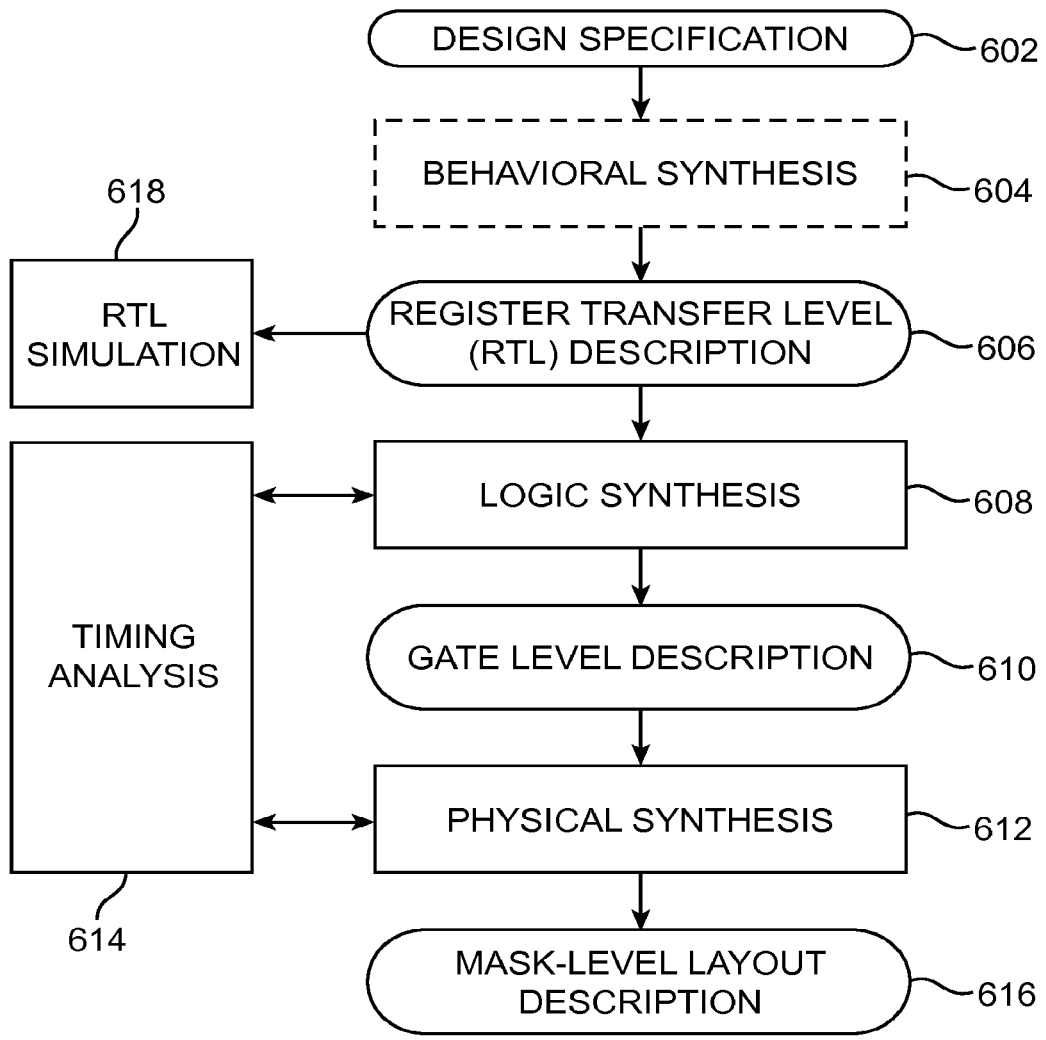
FIG. 13 is a flow chart of illustrative steps for designing an integrated circuit in accordance with an embodiment.

Illustrative operations involved in using tools 520 of FIG. 12 to produce the mask-level layout description of the integrated circuit are shown in FIG. 13.

As shown in FIG. 13, a circuit designer may first provide a design specification 602. The design specification 602 may, in general, be a behavioral description provided in the form of an application code (e.g., C code, C++ code, SystemC code, OpenCL code, etc.). In some scenarios, the design specification may be provided in the form of a register transfer level (RTL) description 606. The RTL description may have any form of describing circuit functions at the register transfer level. For example, the RTL description may be provided using a hardware description language such as the Verilog hardware description language (Verilog HDL or Verilog), the SystemVerilog hardware description language (SystemVerilog HDL or SystemVerilog), or the Very High Speed Integrated Circuit Hardware Description Language (VHDL). Alternatively, the RTL description may be provided as a schematic representation.

In general, the behavioral design specification 602 may include untimed or partially timed functional code (i.e., the application code does not describe cycle-by-cycle hardware behavior), whereas the RTL description 606 may include a fully timed design description that details the cycle-by-cycle behavior of the circuit at the register transfer level.

Design specification 602 or RTL description 606 may also include target criteria such as area use, power consumption, delay minimization, clock frequency optimization, or any combination thereof. The optimization constraints and target criteria may be collectively referred to as constraints.

Those constraints can be provided for individual data paths, portions of individual data paths, portions of a design, or for the entire design. For example, the constraints may be provided with the design specification 602, the RTL description 606 (e.g., as a pragma or as an assertion), in a constraint file, or through user input (e.g., using the design and constraint entry tools 564 of FIG. 3), to name a few. In certain embodiments, a given data path may have more than one constraint associated with the path, and some of these constraints may be in conflict with each other (e.g., a constraint received with the behavioral design specification for a given path may conflict with the constraint received with the RTL description and with a constraint received with a constraint file). In this scenario, a predetermined priority of constraints, which may be defined explicitly or resolved implicitly by CAD tools 520, may determine which of the conflicting constraints is selected. For example, the constraint from the user or a configuration file may override the constraints received from other sources, and a constraint received with the RTL description may override a constraint received with the behavioral design specification.

The constraints may target the entire circuit design or portions of the circuit design. For example, some constraints may be defined globally and thus be applicable to the entire circuit design. Other constraints may be assigned locally and thus be applicable only to the corresponding portions of the circuit design. Consider the scenario in which the circuit design is organized hierarchically. In this scenario, every hierarchical instance may include different assignments. In other words, multiple different constraints may target the same portion of the circuit design, and priorities may be defined explicitly or resolved implicitly by CAD tools 520. For example, a constraint defined at a higher level of the design hierarchy may override a constraint at a lower level. Alternatively, a constraint defined at a lower level of the design hierarchy may override a constraint at a higher level, or individual levels of the design hierarchy may be given priority over other levels of design hierarchy.

Constraints included in design specification 602 or RTL description 606 may be conveyed to CAD tools 520 in the form of variables, parameters, compiler directives, macros, pragmas, or assertions, just to name a few. CAD tools 520 may use a constraint file, which may include a portion or all of the constraints. Such a constraint file may be included with design specification 602 or RTL description 606. In some scenarios, a portion or all of the constraints may be embedded in the circuit design. Alternatively, the constraints may have been defined using the design and constraint entry tools 564 (see FIG. 5).

At step 604, behavioral synthesis (sometimes also referred to as algorithmic synthesis) may be performed to convert the behavioral description into an RTL description 606. Behavioral synthesis may evaluate data path implementations for each of the data paths with read-modify-write operations in the behavioral design specification. Step 604 may be skipped if the design specification is already provided in form of an RTL description.

At step 618, behavioral simulation tools 572 may perform an RTL simulation of the RTL description, which may verify the functional performance of the RTL description. If the functional performance of the RTL description is incomplete or incorrect, the circuit designer can make changes to the HDL code (as an example). During RTL simulation 618, actual results obtained from simulating the behavior of the RTL description may be compared with expected results.

During step 608, logic synthesis operations may generate gate-level description 610 using logic synthesis and optimization tools 574 from FIG. 12.

During step 612, physical synthesis operations (e.g., place and route and optimization operations using for example placement and routing tools 576) may place and connect the different gates in gate-level description 610 in a preferred location on the targeted integrated circuit to meet given target criteria (e.g., minimize area and maximize routing efficiency or minimize path delay and maximize clock frequency or any combination thereof). The output of physical synthesis 612 is a mask-level layout description 616.

Circuit design system 400 may include timing estimator 614 (e.g., formed as part of optimization tools 574, tools 576, or tools 578) that may be used to estimate delays between synchronous elements of the circuit design. For example, timing estimator 614 may estimate delays between sequential elements such as registers and storage circuits (e.g., based on the lengths of interconnects, intermediate combinational logic, etc.). The delays may, if desired, be estimated based on metrics such as slack (e.g., the difference between a required arrival time and the arrival time of a signal), slack-ratios, interconnect congestion, or other timing metrics. Circuit design system 400 may use the estimated delays to determine the locations of groups of circuitry while helping to ensure that delays satisfy timing requirements (e.g., critical path delay requirements) or other performance constraints.

Figure 14:
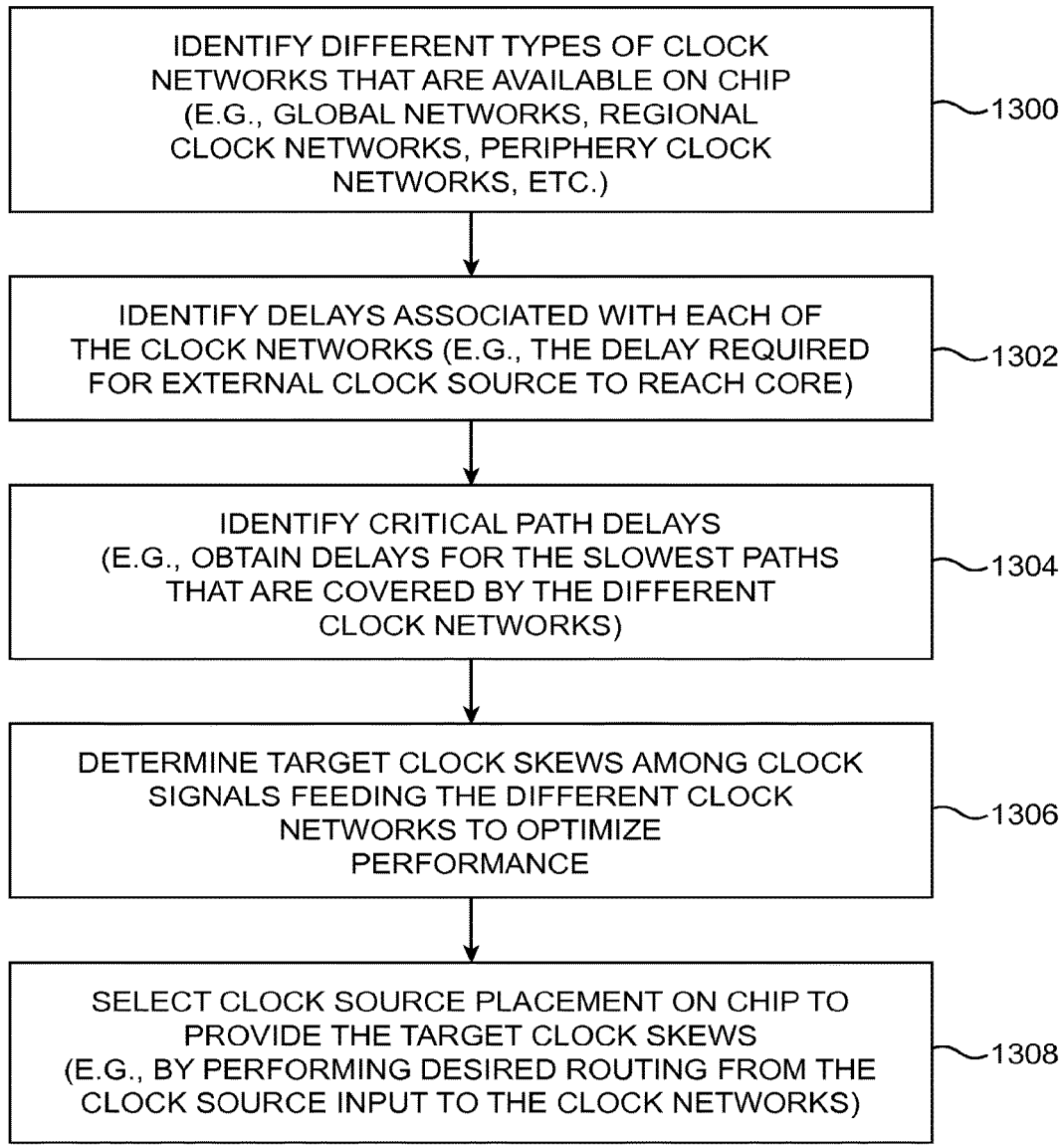
FIG. 14 is a flow chart of illustrative steps involved in configuring a programmable integrated circuit to provide the desired time borrowing scheme in accordance with an embodiment.

CAD tools 520 of the type described above in connection with FIGS. 11-13 may perform steps for selecting clock source placements and routing on an integrated circuit device such that the generation of multiple related clock signals with a specified skew target can be achieved (see, e.g., illustrative steps of FIG. 14). At step 1300, tools 520 may be used to identify the different types of clock distribution networks that are available on chip (e.g., to identify whether the die includes global clock networks, regional clock networks, peripheral clock networks, or other types of clock networks).

At step 1302, the CAD tools may then be used to identify estimated delays associated with each of the different types of clock networks (e.g., the inherent delay associated with the different types of clock trees). This delay can be measured by computing the time difference between a clock signal being output from a clock driver circuit at a first point in time and the clock signal being received at a target register at a second point in time.

At step 1304, the CAD tools may be used to identify critical path delays on the integrated circuit (e.g., to obtain estimated delays for the slowest paths that are covered by each of the different clock networks). In general, clock signals with larger skews/delay should be provided to the slower data paths for optimal time borrowing.

At step 1306, the CAD tools may then determine the target clock skews that should be used among the different clock signals being fed to the various clock networks. For example, the CAD tools may determine that flip-flops in slowest paths should receive clocks with an appropriate amount of clock skew, so that time is borrowed from the faster logic paths. This ensures that the clock speed for the entire circuit need not be slowed to accommodate worst-case delays.

At step 1308, the CAD tools may intelligently select the desired on-chip clock source placement and the corresponding routing to realize the target clock skews. For example, clock signals with larger clock skews may be implemented by placing the clock source further away from the clock network driver and/or by coupling the clock source to the clock network driver using a longer wire. As another example, clock signals with minimal clock skews may be implemented by placing the clock source adjacent to the clock network driver and/or by coupling the clock source to the clock network driver using the shortest possible wire. As yet another example, the desired clock skew can be provided by tuning adjustable delay circuits inserted in the clock paths (see, e.g., FIG. 9).

The steps of FIG. 14 can be performed multiple times as the estimated delays associated with the clock networks, critical data paths, and clock routing paths become more accurate during the synthesis flow of FIG. 13. For example, a first iteration of the clock source placement and routing can be performed following behavioral synthesis 604 based on a first set of estimated delay values. After logic synthesis 608, a second set of estimated delay values which are generally more accurate than the first set of estimated delay values can then be obtained. A second iteration of the clock source placement and routing can then be performed. After physical synthesis 612 (e.g., after place and route optimization), a third set of estimated delay values which should be even more representative of the actual delay values relative to the second set of estimated delay values can be obtained (since the CAD tool now knows where the various gates and circuits are physically located on the die). Thereafter, a third iteration of the clock source placement and routing can be performed to provide a clocking configuration that optimizes performance based on the most up-to-date information.

The steps of FIG. 14 are merely illustrative and the existing steps may be modified or omitted, additional steps may be added, and the order of certain steps may be altered.

The embodiments described herein where desired clock skews are generated from different types of clock distribution networks are merely illustrative. If desired, clock skews can be generated from the same type of clock networks (e.g., clock distribution networks that cover the same amount of area on the integrated circuit), but the clock networks serve slightly different physical locations on the integrated circuit. For example, a first clock network that covers the top three-quarters of the die may receive clock signals from a given clock source and a second clock network that covers the bottom three-quarters of the die may receive clock signals from the given clock source. The first and second clock networks may therefore exhibit the same amount of native delay. In this example, half of the die may be served by an overlapping portion of the first and second clock networks and the logic circuits formed in that region is operable to leverage any existing clock skew that is generated as a result.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by ALTERA Corporation.

The foregoing is merely illustrative of the principles of this invention and various modifications can be made by those skilled in the art. The foregoing embodiments may be implemented individually or in any combination.

Although the invention has been described in some detail for the purposes of clarity, it will be apparent that certain changes and modifications can be practiced within the scope of the appended claims. Although some of the appended claims are single dependent only or reference only some of their preceding claims, their respective feature(s) can be combined with the feature(s) of any other claim.

What is claimed is:

1. An integrated circuit device comprising:
   a first stage of combinational logic circuitry in programmable logic fabric of the integrated circuit device, wherein the first stage of combinational logic circuitry is disposed between a first latch and a second latch; and
   a second stage of combinational logic circuitry in programmable logic fabric of the integrated circuit device, wherein the second stage of combinational logic circuitry is disposed between the second latch and a third latch;
   wherein:
   the first stage of combinational logic circuitry has a first delay and wherein the second stage of combinational logic circuitry has a second delay that is different from the first delay by a first time difference;
   the first latch is clocked to a first clock, the second latch is clocked to a second clock, and the third latch is clocked to the first clock, wherein the first clock and the second clock have the same frequency, and wherein at least one clock edge of the first clock is greater than or less than 180° out of phase with at least one clock edge of the second clock by a second time difference; and the second time difference between the at least one clock edge of the first clock and the at least one clock edge of the second clock accommodates at least part of the first time difference between the first delay and the second delay between the first stage of combinational logic circuitry and the second stage of combinational logic circuitry.

2. The integrated circuit device of claim 1, wherein the second time difference between the at least one clock edge of the first clock and the at least one clock edge of the second clock enables time borrowing between the first stage of combinational logic circuitry and the second stage of combinational logic circuitry.

3. The integrated circuit device of claim 1, wherein the programmable logic fabric comprises a field programmable gate array fabric.

4. The integrated circuit device of claim 1, wherein the first delay of the first stage of combinational logic circuitry is greater than the second delay of the second stage of combinational logic circuitry, and wherein the first stage of combinational logic circuitry borrows time from the second stage of combinational logic circuitry.

5. The integrated circuit device of claim 1, wherein the first delay of the first stage of combinational logic circuitry is less than the second delay of the second stage of combinational logic circuitry, and wherein the second stage of combinational logic circuitry borrows time from the first stage of combinational logic circuitry.

6. The integrated circuit device of claim 1, wherein the first clock has a different clock skew than the second clock.

7. An article of manufacture comprising one or more tangible, non-transitory, machine-readable instructions that, when executed, cause one or more processors to:
receive a circuit design specification; and
perform placement or routing of circuit elements from the circuit design specification, wherein the placement or routing of circuit elements enables time borrowing between a first stage of circuit elements that has a first delay and a second stage of circuit elements that has a second delay different from the first delay at least in part by:
providing a first latch;
providing a first clock signal to control the first latch, wherein the first clock signal has a first frequency;
providing the first stage of circuit elements immediately after the first latch;
providing a second latch immediately after the first stage of circuit elements;
providing a second clock signal to control the second latch, wherein the second clock signal has the first frequency and comprises at least one clock edge that that has a greater than or less than 180° offset from a corresponding clock edge of the first clock signal; and
providing the second stage of circuit elements immediately after the second latch;
wherein the offset enables time borrowing of the first stage of circuit elements from the second stage of circuit elements or of the second stage of circuit elements from the first stage of circuit elements.

8. The article of manufacture of claim 7, wherein the circuit design specification comprises a programmable logic circuit design specification.

9. The article of manufacture of claim 8, wherein the programmable logic circuit design specification comprises a circuit design specification for a field programmable gate array device.

10. The article of manufacture of claim 7, wherein the offset enables time to be borrowed from an endpoint of the first stage of circuit elements, thereby taking an amount of time allocated to the second stage of circuit elements and giving the amount of time to the first stage of circuit elements.

11. The article of manufacture of claim 7, wherein the offset enables time to be given to a starting point of the second stage of circuit elements, thereby taking an amount of time allocated to the first stage of circuit elements and giving the amount of time to the second stage of circuit elements.

12. The article of manufacture of claim 7, wherein the first stage of circuit elements has a first delay and the second stage of circuit elements has a second delay different from the first delay, wherein the first delay is greater than the second delay, and wherein the first stage of circuit elements borrows time from the second stage of circuit elements.

13. The article of manufacture of claim 7, wherein the first stage of circuit elements has a first delay and the second stage of circuit elements has a second delay different from the first delay, wherein the first delay is less than the second delay, and wherein the second stage of circuit elements borrows time from the first stage of circuit elements.

14. The article of manufacture of claim 7, wherein the first stage of circuit elements comprises first combinational logic circuitry and the second stage of circuit elements comprises second combinational logic circuitry.

15. The article of manufacture of claim 7, wherein the instructions to perform placement or routing of circuit elements from the circuit design specification comprise instructions to enable time borrowing between the first stage of circuit elements and the second stage of circuit elements at least in part by:
providing a third latch immediately after the second stage of circuit elements; and
providing the first clock to control the first latch.

16. A data processing system comprising:
a system processor; and
a programmable logic device communicatively coupled to the processor, wherein the programmable logic device comprises:
a first stage of combinational logic circuitry in programmable logic fabric of the programmable logic device, wherein the first stage of combinational logic circuitry is disposed between a first latch and a second latch; and
a second stage of combinational logic circuitry in programmable logic fabric of the programmable logic device, wherein the second stage of combinational logic circuitry is disposed between the second latch and a third latch;
wherein:
the first stage of combinational logic circuitry has a first delay and wherein the second stage of combinational logic circuitry has a second delay that is different from the first delay by a first time difference;
the first latch is clocked to a first clock, the second latch is clocked to a second clock, and the third latch is clocked to the first clock, wherein the first clock and the second clock have the same frequency, and wherein at least one clock edge of the first clock is greater than or less than 180° out of phase with at least one clock edge of the second clock by a second time difference; and the second time difference between the at least one clock edge of the first clock and the at least one clock edge of the second clock accommodates at least part of the first time difference between the first delay and the second delay between the first stage of combinational logic circuitry and the second stage of combinational logic circuitry.

17. The data processing system of claim 16, wherein the data processing system is configured to perform computer networking, data networking, instrumentation, video processing, digital signal processing, or any combination thereof.

18. The data processing system of claim 16, wherein the programmable logic device is configured to operate as a secondary processor or a controller that works in cooperation with the processor.

19. The data processing system of claim 16, wherein the data processing system comprises a shared resource, wherein the programmable logic device is configured to arbitrate access to the shared resource.

20. The data processing system of claim 16, wherein the programmable logic device is configured to form an interface between the processor and another circuit of the data processing system.

* * * * *